United States Patent
Duncan-Wilson

(10) Patent No.: US 10,393,779 B2
(45) Date of Patent: Aug. 27, 2019

(54) SYSTEMS AND METHODS FOR PROVIDING STATISTICAL DYNAMIC METER DATA VALIDATION

(71) Applicant: ORACLE INTERNATIONAL CORPORATION, Redwood Shores, CA (US)

(72) Inventor: Jason J. Duncan-Wilson, Cincinnati, OH (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 437 days.

(21) Appl. No.: 15/086,273

(22) Filed: Mar. 31, 2016

(65) Prior Publication Data

US 2017/0285079 A1   Oct. 5, 2017

(51) Int. Cl.
*G01R 21/133* (2006.01)
*G06Q 30/02* (2012.01)
*G06Q 50/06* (2012.01)

(52) U.S. Cl.
CPC ....... *G01R 21/133* (2013.01); *G06Q 30/0201* (2013.01); *G06Q 50/06* (2013.01)

(58) Field of Classification Search
None
See application file for complete search history.

(56) References Cited

U.S. PATENT DOCUMENTS

| 5,995,022 A * | 11/1999 | Plis | G01R 21/1333 340/870.02 |
| 2008/0114499 A1 * | 5/2008 | Hakim | G06Q 50/06 700/291 |
| 2011/0215945 A1 | 9/2011 | Peleg et al. | |
| 2011/0257911 A1 * | 10/2011 | Drees | G05B 15/02 702/61 |
| 2011/0320056 A1 * | 12/2011 | Brown | B60L 3/0069 700/295 |

(Continued)

OTHER PUBLICATIONS

"Demand Response and Advanced Metering" by David Kathan et al., Dec. 2008.*

(Continued)

*Primary Examiner* — Evren Seven
(74) *Attorney, Agent, or Firm* — Kraguljac Law Group, LLC

(57) ABSTRACT

Systems, methods, and other embodiments are disclosed for validating measured meter data. In one embodiment, a graphical user interface is provided that facilitates configuration of a validation algorithm by a user. Historical usage data is accessed during a non-peak time to offload processing from a peak time. The non-peak time corresponds to a time span when the measured meter data is not being received and validated, and the peak time corresponds to a different time span when the measured meter data is being received and validated. Statistical data is generated from the historical usage data during the non-peak time and stored in a memory. The measured meter data is received and the statistical data is accessed during the peak time. The measured meter data is validated by applying the validation algorithm to the statistical data and the measured meter data during the peak time.

20 Claims, 6 Drawing Sheets

(56) References Cited

U.S. PATENT DOCUMENTS

| | | | |
|---|---|---|---|
| 2012/0271576 A1* | 10/2012 | Kamel | H02J 13/0006 |
| | | | 702/62 |
| 2013/0144769 A1 | 6/2013 | Swaminathan et al. | |
| 2013/0191659 A1 | 7/2013 | Ree et al. | |
| 2017/0176502 A1* | 6/2017 | Saneyoshi | G01R 21/06 |
| 2017/0176503 A1* | 6/2017 | Saneyoshi | G01R 21/133 |

OTHER PUBLICATIONS

Patent Cooperation Treaty (PCT) International Search Report and Written Opinion in co-pending PCT International Appl. No. PCT/US2017/024412 (International Filing Date of Mar. 28, 2017) dated Jun. 9, 2017 (11 pgs.).

* cited by examiner

VEE Rule

Main

Record Actions
[Edit] [Duplicate] [Delete]

Record Information
Business Object: Dynamic Comparison Validation

Insufficient Input Data Exception
Exception Type: Insufficient Input Data
Exception Severity: Informational

Dynamic Comparison Exception
Exception Type: Unexpected Negative Measurement
Exception Severity: Informational VEE Group: Interval Electric
VEE Rule: INT_E_KWH_DYN_COMP_VAL1
Sequence: 30
Description: Interval kWh Dynamic Validation -- Negative
Detailed Description:
Category: Validation Rules
Start Date: 01-01-2015
End Date:

General Rule Parameters
Statistics Inclusion Days: 7

Equation Details
IMD1 < 0 AND CS1 = 0    410

Initial Measurement Values

| Variable Name | Calculation Function |
|---|---|
| IMD1 | Minimum |

420

Channel Statistics Values

| Variable Name | Measuring Component Type | Value Identifier |
|---|---|---|
| CS1 | MC Stats -- Prior 13 Months | Negative Count |

430

Weather Values

FIG. 4

Example 1: Detect new "high water mark" 510

Historical Statistics

Statistics MC Type: MC_STATS_13MONTHS

| | | |
|---|---|---|
| Max | 15 min | 4.320 |

Dynamic Values

Variable Name: IMD1
- Source Type: IMD
- Set Function: Max

Variable Name: CS1
- Source Type: Channel Statistics
- MC Type: MC_STATS_13MONTH
- Value: Max

Equation

IMD1 > CS1 * 1.1

This equation is comparing the max interval in the new IMD to the max interval from the last 13 months of history from the MC. If greater than 110% of max then fail.

Example 2: High Usage 520

Historical Statistics

Statistics MC Type: MC_STATS_LASTMONTH

| | | |
|---|---|---|
| Average | 15 min | 1.630 |
| Standard Deviation | 15 min | 0.519 |

Statistics MC Type: MC_STATS_LASTYEAR

| | | |
|---|---|---|
| Average | 15 min | 1.893 |
| Standard Deviation | 15 min | 0.851 |

Dynamic Values

Variable Name: IMD1
- Source Type: IMD
- Set Function: Max

Variable Name: CS1
- Source Type: Channel Statistics
- MC Type: MC_STATS_LASTMONTH
- Value: Average

Variable Name: CS2
- Source Type: Channel Statistics
- MC Type: MC_STATS_LASTMONTH
- Value: Standard Deviation

Variable Name: CS3
- Source Type: Channel Statistics
- MC Type: MC_STATS_LASTYEAR
- Value: Average

Variable Name: CS4
- Source Type: Channel Statistics
- MC Type: MC_STATS_LASTYEAR
- Value: Standard Deviation

Equation (IMD1 - CS1) / CS2 > 3
AND (IMD1 - CS3) / CS4 > 3

This equation checks that the standard score of the current max interval is within 3 standard deviations of historical data from last month and last year. If greater than 3 standard deviations, an exception is thrown.

FIG. 5

SYSTEMS AND METHODS FOR PROVIDING STATISTICAL DYNAMIC METER DATA VALIDATION

BACKGROUND

A consumption meter measures usage (i.e., consumption) over time of, for example, electricity, natural gas, or water by a customer of a utility provider. Traditional interval consumption meters and newer advanced metering infrastructure (AMI) "smart" consumption meters are minimally configured with two channels of consumption data being that of, for example, interval consumption data and register (scalar) consumption data.

Currently, a large volume of data is received from AMI smart meters on the electrical grid into either customer systems or meter data management applications. This data is received frequently, for example, often daily or intra-daily. The data requires validation to guarantee that the data is of sufficient quality to present back to the customers of a utility and to create a bill for payment to the customer associated with the meter.

The process of validating the data relies on knowledge of trends from prior history from the same meter. Other applications calculate the historical values either in-stream as the data is received or in batch after the data has been loaded into the system. Such processing methods lead to the need for a large central processing unit (CPU) footprint to process the data in a timely manner and/or a delayed data presentation to downstream systems.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be designed as multiple elements or that multiple elements may be designed as one element. In some embodiments, an element shown as an internal component of another element may be implemented as an external component and vice versa. Furthermore, elements may not be drawn to scale.

FIG. 4 illustrates an example embodiment of a displayed screen of a graphical user interface provided by usage confirmation logic of the computer system of FIG. 1;

FIG. 5 illustrates example embodiments of validating measured meter data.

DETAILED DESCRIPTION

Figure 1:
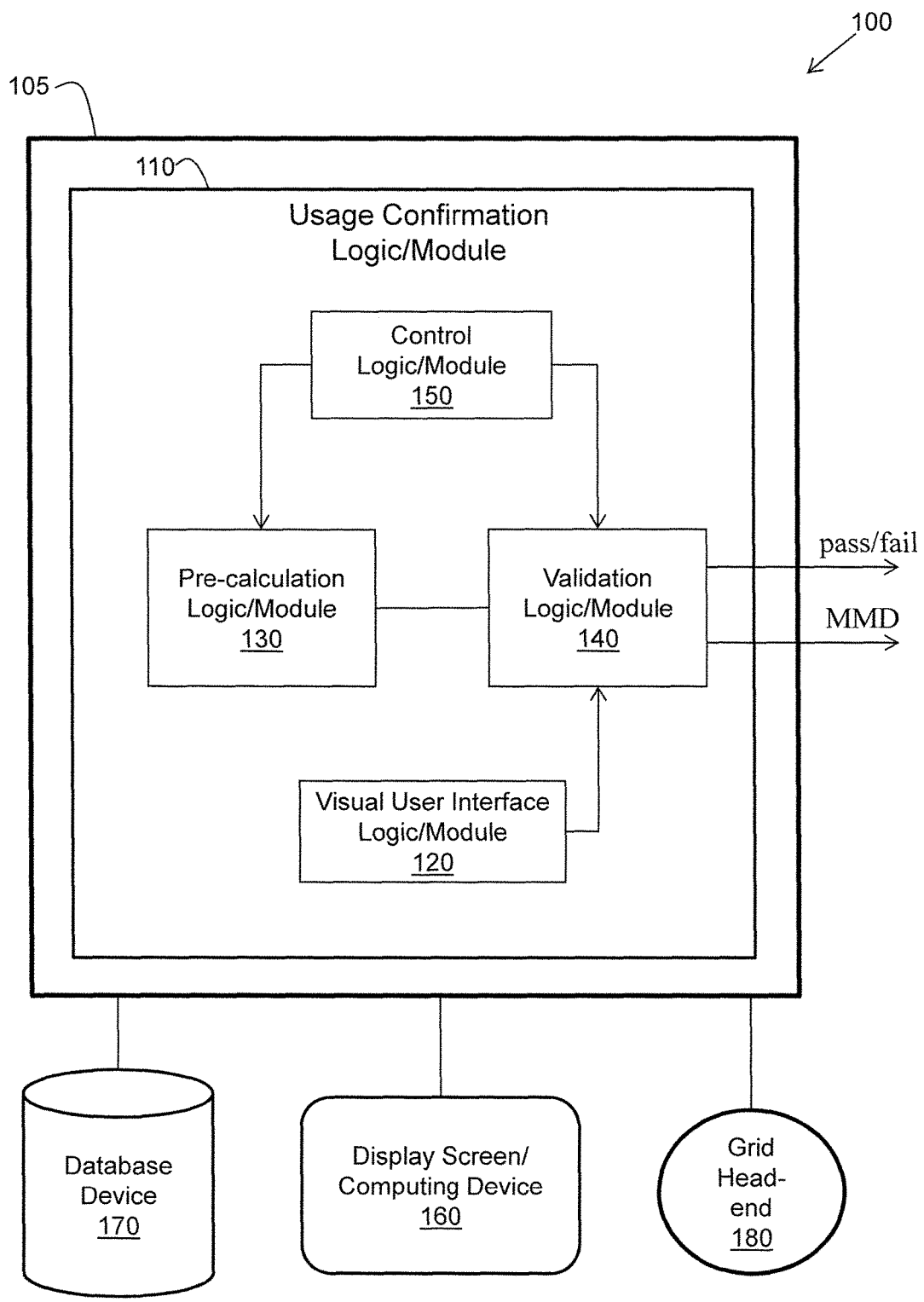
FIG. 1 illustrates one embodiment of a computer system, having a computing device configured with usage confirmation logic.

Systems, methods, and other embodiments are disclosed that pre-calculate key historical statistical data for an electrical meter and stages the data within a system to enable high speed validation of meter data. The historical statistical data may include, for example, a maximum value, a minimum value, a summed value, a standard deviation value, a median value, and an average value for several critical historical periods for the meter (e.g., last month, the contiguous month last year, and the last thirteen (13) months). Pre-calculating such statistical data shifts the processing load to "off-peak" times to better utilize the CPU footprint and to speed up the loading of new meter data.

To properly use the pre-calculated historical statistical data, a flexible rule is introduced which allows a user of the system to dynamically create an equation (a validation algorithm) that puts the pre-calculated historical statistical data into a mathematical and/or logical formula for validation purposes. Embodiments provide the flexibility for electrical engineers at a utility to define their own formulas for validation. The pre-calculation of the statistics and the user-defined formula provide the ability to use the meter data in a dynamic manner within the validation process.

In accordance with one embodiment, usage confirmation logic is disclosed that accesses historical usage data from a database device during a non-peak time to off-load processing from a peak time. The historical usage data is previously collected from an electrical grid via a grid head-end device and stored in the database device. The non-peak time corresponds to a time span when measured meter data is not being received and processed for validation. The peak time corresponds to a different time span when the measured meter data is being received and processed for validation. During the non-peak time, statistical data is generated from the historical usage data and the statistical data is stored in memory to off-load processing from the peak time. During the peak time, measured meter data is received from the grid head-end device and the statistical data is accessed from the memory. The measured meter data is validated during the peak time by applying a validation algorithm to the statistical data and the measured meter data to generate pass/fail data.

The following terms are used herein with respect to various embodiments.

The term "measured meter data", as used herein, refers to recent electrical usage data that is to be validated and is generated by one or more electrical meters connected to an electrical grid as interval consumption data, register (scalar) consumption data, or both.

The term "historical usage data", as used herein, refers to past electrical usage data that is generated by one or more electrical meters connected to an electrical grid and which is to be used to validate measured meter data.

The term "non-peak time", as used herein, refers to a time span when measured meter data is not being received and processed for validation.

The term "peak time", as used herein, refers to a different time span when measured meter data is being received and processed for validation.

The term "validation algorithm", as used herein, refers to a formula including mathematical and/or logical functions that compare statistics of historical usage data to recently measured meter data to check for anomalies in the recently measured meter data. When the validation algorithm does not detect any anomalies, the measured meter data is considered to be validated.

The term "grid head-end device", as used herein, refers to a device that is configured to collect electrical usage data from an electrical grid.

FIG. 1 illustrates one embodiment of a computer system 100, having a computing device 105 configured with usage confirmation logic 110. For example, in one embodiment, usage confirmation logic 110 may be part of a larger computer application (e.g., a computerized utility management application), configured to help manage various aspects of an electrical utility company including billing of customers. Usage confirmation logic 110 is configured to computerize the process of validating measured meter data (MMD) collected from an electrical grid in part by off-loading some of the processing from a peak time to a non-peak time. The embodiments described herein take into consideration measured meter data that includes interval consumption data, register (scalar) consumption data, or both.

Usage confirmation logic 110 is configured to computerize the process of controlling when the processing of various types of electrical usage data is to be performed to reduce a CPU footprint of at least the computing device 105 of the system 100. In one embodiment, the system 100 is a computing/data processing system including an application or collection of distributed applications for enterprise organizations. The applications and computing system 100 may be configured to operate with or be implemented as a cloud-based networking system, a Software as a Service (SaaS) architecture, or other type of computing solution.

With reference to FIG. 1, in one embodiment, usage confirmation logic 110 is implemented on the computing device 105 and includes logics or modules for implementing various functional aspects of usage confirmation logic 110. In one embodiment, usage confirmation logic 110 includes visual user interface logic/module 120, pre-calculation logic/module 130, validation logic/module 140, and control logic/module 150.

Other embodiments may provide different logics or combinations of logics that provide the same or similar functionality as usage confirmation logic 110 of FIG. 1. In one embodiment, usage confirmation logic 110 is an executable application including algorithms and/or program modules configured to perform the functions of the logics. The application is stored in a non-transitory computer storage medium. That is, in one embodiment, the logics of usage confirmation logic 110 are implemented as modules of instructions stored on a computer-readable medium.

The computer system 100 also includes a display screen 160 operably connected to the computing device 105. In accordance with one embodiment, the display screen 160 is implemented to display views of and facilitate user interaction with a graphical user interface (GUI) generated by visual user interface logic 120 for viewing and updating information associated with a validation algorithm. The graphical user interface may be associated with a usage confirmation algorithm and visual user interface logic 120 may be configured to generate the graphical user interface.

In one embodiment, the computer system 100 is a centralized server-side application that provides at least the functions disclosed herein and that is accessed by many users via computing devices/terminals communicating with the computer system 100 (functioning as the server) over a computer network.

Thus the display screen 160 may represent multiple computing devices/terminals that allow users to access and receive services from usage confirmation logic 110 via networked computer communications.

In one embodiment, the computer system 100 further includes at least one database device 170 operably connected to the computing device 105 and/or a network interface to access the database device 170 via a network connection. For example, in one embodiment, the database device 170 is operably connected to pre-calculation logic 130. In accordance with one embodiment, the database device 170 is configured to store and manage data structures associated with usage confirmation logic 110 in a database system (e.g., a computerized historical electrical usage application). The data structures may include, for example, records of historical usage data.

In one embodiment, the computer system 100 also includes at least one grid head-end device 180 operably connected to the computing device 105 and/or a network interface to access the grid head-end device 180 via a network connection. For example, in one embodiment, the grid head-end device 180 is operably connected to validation logic 140. In accordance with one embodiment, validation logic 140 is configured to receive (e.g., stream) recently measured meter data from the grid head-end device 180. The grid head-end device 180 is configured to collect measured meter data from the electrical grid. In one embodiment, grid head-end device 180 is considered to be a part of the electrical grid and not a part of the system 100.

Referring back to the logics of usage confirmation logic 110 of FIG. 1, in one embodiment, visual user interface logic 120 is configured to generate a graphical user interface (GUI) to facilitate user interaction with usage confirmation logic 110 to manually select and/or custom configure a validation algorithm. For example, visual user interface logic 120 includes program code that generates and causes the graphical user interface to be displayed based on an implemented graphical design of the interface. In response to user actions and selections via the GUI, associated aspects of manually selecting or custom configuring a validation algorithm may be manipulated.

For example, in one embodiment, visual user interface logic 120 is configured to facilitate selecting a formula in response to user actions. For example, visual user interface logic 120 may facilitate manual selection of a formula from multiple formulas provided by usage confirmation logic 110. Each formula may be pre-stored in a memory of the computing device 105 as a validation algorithm which comprises computer-executable instructions and/or data. A selected validation algorithm may be applied to historical statistical usage data and recently measured meter data by validation logic 140, in accordance with one embodiment.

In one embodiment, visual user interface logic 120 is configured to facilitate the configuring of a formula in response to user actions. For example, visual user interface logic 120 may facilitate the selection and custom configuring of mathematical functions and logical functions from multiple functions provided by usage confirmation logic 110 to form a formula. The custom configured formula may be stored in a memory of the computing device 105 as a validation algorithm. The validation algorithm may comprise computer-executable instructions and/or data which may be applied to historical statistical usage data (statistical data) and recently measured meter data by validation logic 140, in accordance with one embodiment. Furthermore, in one embodiment, visual user interface logic 120 is configured to facilitate the outputting and displaying of pass/fail data indicating whether the recently measured meter data has been validated (passed) or not (failed).

Referring again to FIG. 1, in one embodiment, pre-calculation logic 130 is configured to access historical usage data from the database device 170 and generate statistical data from the historical usage data. The statistical data is stored in a memory of the computing device 105. In one embodiment, the historical usage data is collected over time from an electrical grid by one or more grid head-end devices (e.g., grid head-end device 180 of FIG. 1) and stored in the database device 170. In one embodiment, pre-calculation logic 130 is controlled such that historical usage data is accessed and the statistical data is generated during an off-peak time as discussed later herein with respect to control logic 150.

The historical usage data may include data generated by one or more electrical meters connected to the electrical grid as interval consumption data, register (scalar) consumption data, or both. The historical usage data may correspond to one or more periods of time. For example, the historical usage data may correspond to the past thirteen (13) months and may represent normal or expected usage of electrical power for those months.

The statistical data derived from the historical usage data may include, for example, a summed value of the historical usage data, a maximum value of the historical usage data, a minimum value of the historical usage data, an average value of the historical usage data, a median, value of the historical usage data, and a standard deviation value of the historical usage data. Such statistics represent consumed energy information associated with the historical usage data. In one embodiment, historical usage data is in the form of kilowatt hours (kWh) over a defined period of time.

Additional statistical data derived from the historical usage data may include, for example, a total count value of the historical usage data, a zero count value of the historical usage data, and a negative count value of the historical usage data. The total count value is a total count of intervals/readings during the historical time period (e.g., last month, same month last year, past 13 months). The zero count value is the total count of intervals/readings that registered as zero usage during the historical time period. The negative count value is the total count of intervals/readings that registered as negative usage (less than zero usage) during the historical time period. Negative usage may occur, for example, when a customer provides more power back to the grid than they consume, or when an anomalous or false reading occurs. Other statistical values are possible as well, in accordance with other embodiments.

In one embodiment, validation logic 140 is configured to generate pass/fail data by applying a validation algorithm to the statistical data (derived from the historical usage data) and recently measured meter data collected from the electrical grid by the grid head-end device 180. The validation algorithm is selected or custom configured by a user (e.g., an electrical engineer), using visual user interface logic 120, to validate the measured meter data. For example, an electrical engineer of a utility company may have deep insight into what constitutes valid measured meter data and is, therefore, in the best position to select or configure a validation algorithm accordingly.

Validation logic 140 may access the statistical data from the memory in which the statistical data was stored by pre-calculation logic 130. Also, validation logic 140 may receive (e.g., stream in) recently measured meter data from the grid head-end device 180. In one embodiment, validation logic 140 is controlled such that the statistical data is accessed, the measured meter data is received, and validation is performed during a peak time as discussed later herein with respect to control logic 150.

The validation algorithm may include a formula of mathematical functions (e.g., addition, subtraction, multiplication, division, etc.), logical functions (e.g., AND, OR, XOR, etc.), or both. Examples of validation algorithms are provided later herein within respect to FIG. 4 and FIG. 5. When recently measured meter data is fed into the validation algorithm, the measured meter data will either pass or fail the validation process, as defined by the validation algorithm. Passing the validation process means that, with respect to the statistical data, no anomalies exist in the measured meter data. Similarly, failing the validation means that, with respect to the statistical data, at least one anomaly exists in the measured meter data.

When the recently measured meter data passes the validation process, validation logic 140 outputs a pass signal or message and sends the corresponding measured meter data on to other systems for subsequent processing (e.g., for customer billing). When the recently measured meter data fails the validation process, validation logic 140 outputs a fail signal or message and alerts other parts of the system 100, or other external systems, to investigate the failure. The fail signal or message may include detailed information with respect to the one or more detected anomalies. The validation algorithm, as selected or configured by the user, defines the pass/fail conditions and boundaries.

In one embodiment, control logic 150 is configured to command pre-calculation logic 130 to, during the non-peak time, access the historical usage data from the database device 170 and generate the statistical data to off-load processing of the computing device 105 from the peak time. Furthermore, control logic 150 is configured to command validation logic 140 to, during the peak time, access the statistical data from the memory, receive the recently measured meter data from the grid head-end device 180, and generate the pass/fail data by applying the validation algorithm to the statistical data and the measured meter data.

In accordance with one embodiment, control logic 150 is knowledgeable of the peak time and the non-peak time. Therefore, control logic 150 can discern when to command pre-calculation logic 130 and when to command validation logic 140. By commanding pre-calculation logic 130 to access the database device 170 and generate the statistical data during the non-peak time, a substantial amount of data accessing and processing associated with generating the statistical data is off-loaded from the peak time to the non-peak time. Similarly, by commanding validation logic 140 to access the statistical data and receive the measured meter data during the peak time, a substantial amount of data receiving, accessing, and processing associated with validating the measured meter data is restricted to the peak time.

Otherwise, having to perform the pre-calculation functions and the validation functions within a same time span would require the processing capability (i.e., the CPU footprint) of the computing device 105 to be significantly larger. By restricting the pre-calculation functions (performed by pre-calculation logic 130) and the validation functions (performed by validation logic 140) to two different time spans via control logic 150, usage confirmation becomes much more manageable and less taxing on system capabilities.

In this manner, confirmation and validation of electrical usage of one or more electrical meters over a period of time can be performed in a controlled manner without overburdening an associated computing system. Furthermore, the exact nature of how to validate measured meter data can be configured as a validation algorithm by a user (e.g., an electrical engineer) of a utility company, for example.

Figure 2:
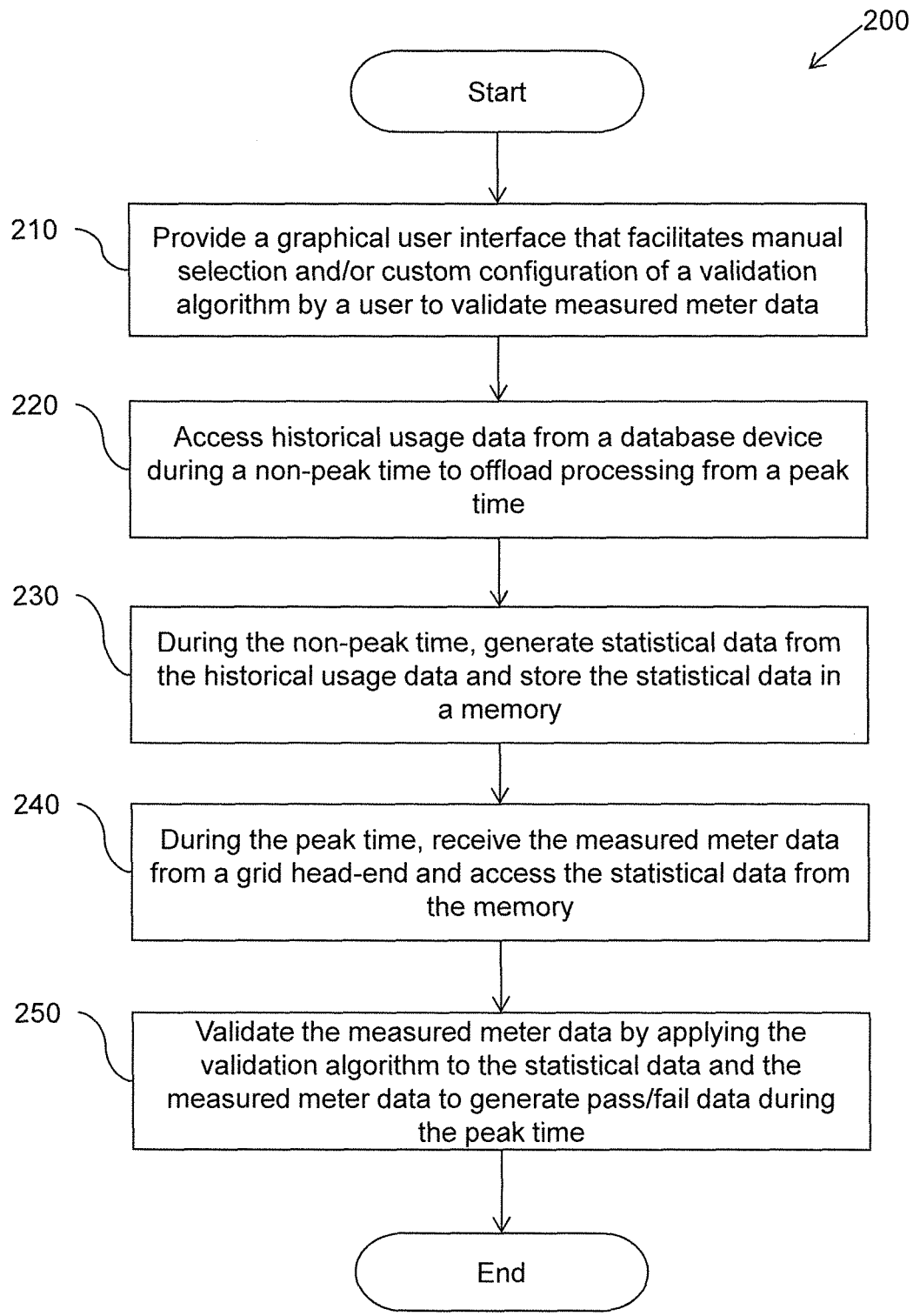
FIG. 2 illustrates one embodiment of a method, which can be performed by usage confirmation logic of the computer system of FIG. 1, for validating measured meter data.

FIG. 2 illustrates one embodiment of a method 200, which can be performed by usage confirmation logic 110 of the computer system 100 of FIG. 1, for validating measured meter data. Method 200 describes operations of usage confirmation logic 110 and is implemented to be performed by usage confirmation logic 110 of FIG. 1, or by a computing device configured with an algorithm of the method 200. For example, in one embodiment, method 200 is implemented by a computing device configured to execute a computer application. The computer application is configured to process data in electronic form and includes stored executable instructions that perform the functions of method 200.

Method 200 will be described from the perspective that recently measured meter data from one or more customer electrical meters can be received via networked computer communications and compared to historical measured meter data (a.k.a. historical usage data). The comparison is performed by a validation algorithm which is configured to validate the recently measured meter data (i.e., determine if any anomalies exist in the recently measured meter data with respect to the historical usage data).

Recently measured meter data and historical usage data may include one or more of interval consumption data or register (scalar) consumption data corresponding to multiple electrical meters of consumers. It is assumed herein that the historical usage data has been previously collected and stored (e.g., in a database device) and is updated as new data is collected over time. For example, in one embodiment, the last 13 months of historical usage data may be maintained in a database device.

Upon initiating method 200, at block 210, a graphical user interface is provided that facilitates manual selection and/or custom configuration of a validation algorithm by a user (e.g., an electrical engineer of a utility company). The validation algorithm is for validating measured meter data collected from an electrical grid via a grid head-end device. In accordance with one embodiment, the graphical user interface is generated by visual user interface logic 120 of FIG. 1 and displayed to a user on display screen 160 of FIG. 1.

At block 220, historical usage data is accessed from a database device (e.g., database device 170 of FIG. 1) during a non-peak time to off-load processing from a peak time. The historical usage data is previously collected from the electrical grid via the grid head-end device and stored in the database device. The historical usage data represents measured meter data from previous time periods (e.g., previous days, weeks, months).

The non-peak time corresponds to a time span when recently measured meter data is not being received and processed for validation. The peak time corresponds to a different time span when recently measured meter data is being received and processed for validation. In accordance with one embodiment, the historical usage data is accessed from the database device 170 by pre-calculation logic 130 (e.g., via networked computer communications). Control commands may be generated (e.g., by control logic 150 of FIG. 1), based on the non-peak time, to command pre-calculation logic 130 to access the historical usage data, in accordance with one embodiment.

At block 230, during the non-peak time, statistical data is generated from the historical usage data and stored in a memory. The statistical data provides a "rolled-up" representation of the historical usage data in the sense that the historical usage data may include hundreds or thousands of data point values for each meter, for example, whereas the statistical data may include a dozen values for each meter. In accordance with one embodiment, the statistical data is generated and stored in a memory by pre-calculation logic 130 of FIG. 1. Control commands may be generated (e.g., by control logic 150 of FIG. 1), based on the non-peak time, to command pre-calculation logic 130 to generate and store the statistical data, in accordance with one embodiment.

At block 240, during the peak time, recently measured meter data is received from the grid head-end device and the statistical data is accessed from the memory. It is assumed that a validation algorithm has been manually selected or custom configured by a user via the graphical interface provided at block 210 such that the recently measured meter data can be validated. A selected or configured validation algorithm may include, for example, a combination of mathematical functions and logical functions that operate on the statistical data and the recently measured meter data. In accordance with one embodiment, receiving of the recently measured meter data and accessing of the statistical data is performed by validation logic 140 of FIG. 1. Control commands may be generated (e.g., by control logic 150 of FIG. 1), based on the peak time, to command validation logic 140 to access the statistical data and receive the recently measured meter data, in accordance with one embodiment.

The recently measured meter data is collected by the grid head-end device from one or more electrical meters of consumers and corresponds to at least a portion of the historical usage data. That is, the electrical meters associated with the recently measured meter data are also associated with at least a portion of the historical usage data. In this way, a valid comparison can be made to validate the recently measured meter data.

At block 250, during the peak time, the recently measured meter data is validated by applying the validation algorithm to the statistical data and the measured meter data to generate pass/fail data. Again, validating the measured meter data involves determining, via application of the validation algorithm, that no anomalies exist in the recently measured meter data. The validation algorithm, as selected or configured by the user, defines the pass/fail conditions and the anomaly/no-anomaly boundaries. In accordance with one embodiment, the validation algorithm is applied by validation logic 140 of FIG. 1. For example, in one embodiment, the validation algorithm becomes a part of validation logic 140 once the validation algorithm is selected or configured by the user. Control commands may be generated (e.g., by control logic 150 of FIG. 1), based on the peak time, to command validation logic 140 to apply the validation algorithm to the statistical data and the recently measured meter data, in accordance with one embodiment.

The pass/fail data may then be output along with the recently measured meter data to be used by other systems for purposes of, for example, customer billing. In the case of a failure, the pass/fail data may include details about the failure such that the failure can be investigated to determine, for example, if the data was corrupted, if one or more meters had problems, etc.

In this manner, processing loads can be divided between a peak time and a non-peak time such that a smaller CPU footprint can be used to handle the receiving, accessing, and processing of data. Furthermore, the knowledge and experience of electrical engineers at a utility company can be tapped to select or configure an algorithm to validate measured meter data.

Figure 3:
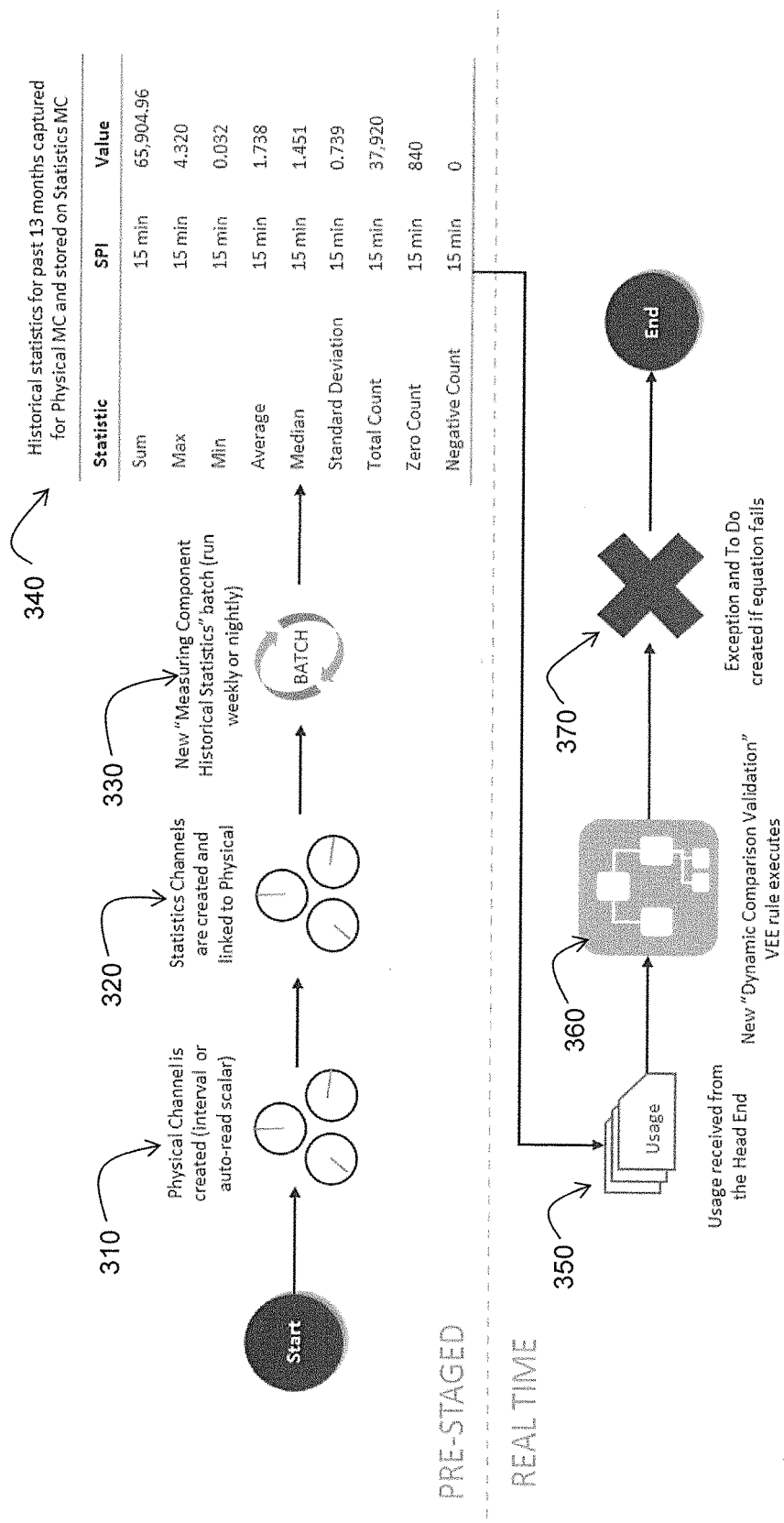
FIG. 3 graphically illustrates an example embodiment of processing historical usage data in a pre-staged manner during an off-peak time, and validating measured meter data in real time during a peak time.

FIG. 3 graphically illustrates an example embodiment of processing historical usage data in a pre-staged manner during an off-peak time, and validating measured meter data in real time during a peak time. In the example of FIG. 3, at 310, interval consumption data and/or register (scalar) consumption data is collected over time from electrical meters of consumers as historical usage data through a physical channel. In one embodiment, the physical channel may be created from one or more grid head-end devices (e.g., grid head-end device 180 of FIG. 1), a database device (e.g., database device 170 of FIG. 1), and a computerized communication network. The computerized communication network is configured to provide communications between the electrical meters and the grid head-end devices, and between the grid head-end devices and the database device.

At 320 in FIG. 3, a statistics channel is created and linked to the physical channel. The statistics channel may be created within a computing device (e.g., computing device 105 of FIG. 1) via usage confirmation logic (e.g., usage confirmation logic 110 of FIG. 1) implemented on the computing device. The statistics channel may be linked to the physical channel (e.g., to database device 170 of FIG. 1) via computerized network communications, in accordance with one embodiment, to access the historical usage data.

At 330 in FIG. 3, the statistics channel accesses historical usage data from the physical channel and generates statistical data (historical statistics). The statistical data may be generated in a batch mode (e.g., a batch mode of usage confirmation logic 110 of FIG. 1) during defined non-peak times (e.g., once per week or nightly). An example of a set of statistical data is shown at 340 in FIG. 3.

During a real time validation operation during a peak time, recently measured meter data (usage data in FIG. 3) is received from one or more grid head-end devices at 350 in FIG. 3. For example in one embodiment, referring to FIG. 1, measured meter data may be streamed from the grid head-end device 180 to computing device 105 having usage confirmation logic 110 implemented thereon.

At 360 of FIG. 3, a validation algorithm is executed to operate on the statistics data and the recently measured meter data to validate the recently measured meter data. In FIG. 3, the validation algorithm is referred to as a validation, estimation, and editing (VEE) rule which makes sure that incoming data (e.g., streamed measured meter data) is valid before it is sent on its way to other systems (e.g., to a customer billing system). Again, the validation algorithm may be a formula which includes a combination of mathematical functions and logical functions, for example.

At 370 of FIG. 3, if the execution of the validation algorithm results in one or more anomalies (exceptions in FIG. 3) being created, such anomalies are recorded and output along with possible actions to be taken (e.g., along with a to-do list of manual and/or automated investigative tasks). Otherwise, when no anomalies are detected by the validation algorithm, pass-indicating data may be output along with the recently measured meter data (MMD) to one or more other systems (e.g., a customer billing system).

FIG. 4 illustrates an example embodiment of a displayed screen 400 of a graphical user interface provided by usage confirmation logic 110 of the computer system 100 of FIG. 1. The displayed screen 400 of the graphical user interface shows a VEE rule at 410 (a validation algorithm) that has been configured by a user having both mathematical and logical functions. The validation algorithm at 410 (equation details) in FIG. 4 is:

$$IMD1 < 0 \text{ AND } CS1 = 0 \text{ (validation algorithm)}$$

where IMD1 is defined as the minimum value of the recently measured meter data (MMD) at 420 and CS1 is defined as the negative count (a statistical value) of the historical usage data over the last 13 months at 430. Again, the negative count value is the total count of intervals/readings that registered as negative usage (less than zero usage) during the historical time period. Negative usage may occur, for example, when a customer provides more power back to the grid than they consume, or when an anomalous or false reading occurs.

According to the validation algorithm at 410 ($IMD1<0$ AND $CS1=0$), if the minimum value of the measured meter data IMD1 is less than zero (0) for an electrical meter, and the negative count value CS1 is equal to zero (0), then the measured meter data from the electrical meter is invalid. In other words, if a reading of negative usage was measured within the recently measured meter data for an electrical meter, but the corresponding historical usage data showed no such instance of negative usage, then the recently measured meter data should be considered invalid. That is, based on the historical usage data, one would not expect there to be any negative usage data in the recently measured meter data for the electrical meter.

FIG. 5 illustrates two example embodiments of validating measured meter data. Example 1 is a "high water mark" example at 510 where the validation algorithm is configured to determine if a maximum value (IMD1) of the recently measured meter data is greater than 110% of the maximum value (CS1) of the historical usage data (i.e., is $IMD1 > CS1*1.1$ ?). If the maximum value of the recently measured meter data is greater than 110% of the historical usage data (defined as being over the last 13 months), then the recently measured meter data is flagged as being invalid. That is, in accordance with the validation algorithm, one would not expect any value of the recently measured meter data to be greater than 110% of the highest historical usage data over the last 13 months.

Example 2 is a "high usage" example at 520 where the validation algorithm is configured to determine if a maximum value (IMD1) of the recently measured meter data is within three (3) standard deviations of the average of the historical usage data from the last month and from the last year. The validation algorithm can be expressed as:

$$(IMD1-CS1)/CS2 > 3 \text{ AND } (IMD1-CS3)/CS4 > 3,$$

where CS1 is the average value of the historical usage data last month, CS2 is the standard deviation value of the historical usage data last month, CS3 is the average value of the historical usage data last year, and CS4 is the standard deviation value of the historical usage data last year. If the maximum value (IMD1) of the recently measured meter data is not within three (3) standard deviations of the average of the historical usage data from the last month and from the last year, then the maximum value (IMD1) is considered to be abnormally high and the recently measured meter data is considered to be invalid.

As seen in Example 2 of FIG. 5, the validation algorithm is a combination of mathematical and logical functions. Many other formulas or equations representing examples of useful validation algorithms are possible as well and are not limited by embodiments herein. A user (e.g., an electrical engineer) has the flexibility to select pre-existing validation algorithms and/or configure newly customized validation algorithms, in accordance with various embodiments.

Furthermore, other embodiments may be concerned with other types of consumption data and meters other than electrical consumption data and electrical meters. For example, other embodiments may be configured to access and process water consumption data provided by water meters or natural gas consumption data provided by natural gas meters. Such other embodiments would work in a similar manner to the electrical usage embodiments described herein.

Computing Device Embodiment

Figure 6:
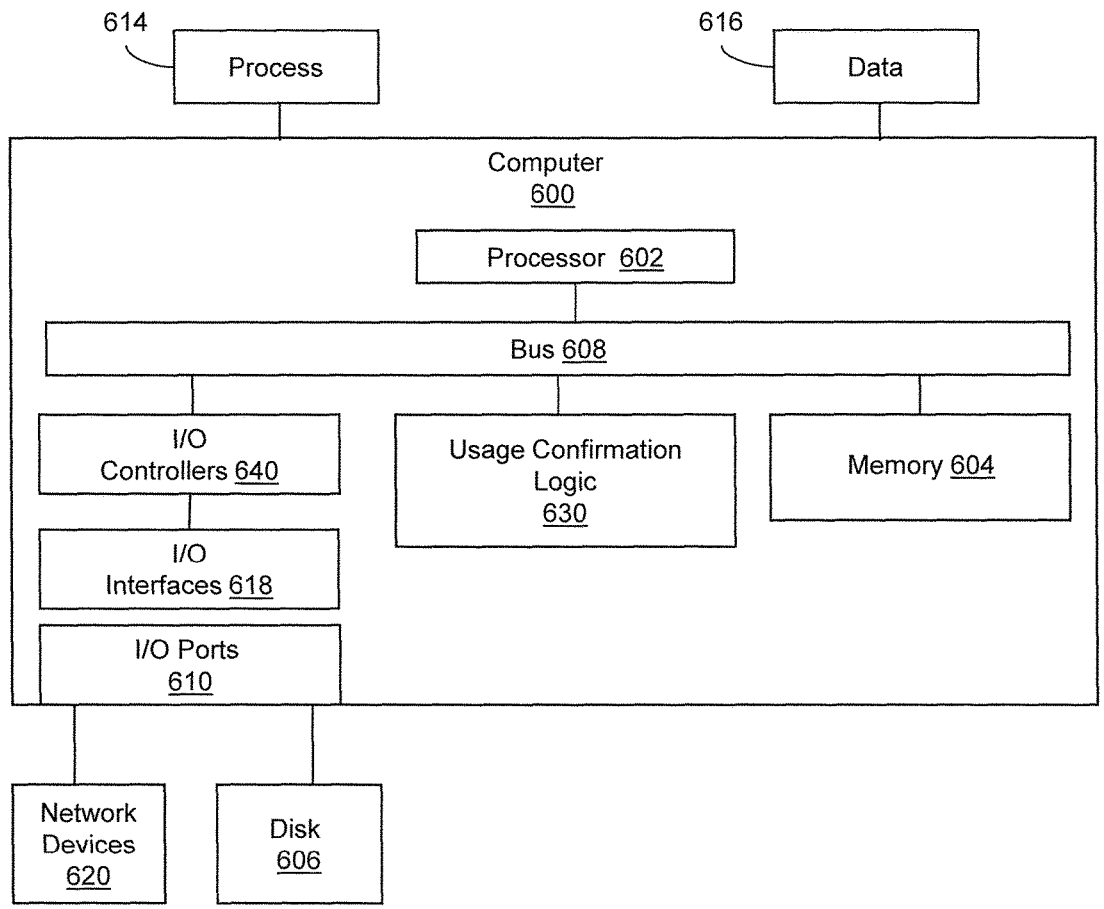
FIG. 6 illustrates one embodiment of a computing device upon which usage confirmation logic of a computing system may be implemented.

FIG. 6 illustrates an example computing device that is configured and/or programmed with one or more of the example systems and methods described herein, and/or equivalents. FIG. 6 illustrates one example embodiment of a computing device upon which an embodiment of usage confirmation logic may be implemented. The example computing device may be a computer 600 that includes a processor 602, a memory 604, and input/output ports 610 operably connected by a bus 608.

In one example, the computer 600 may include usage confirmation logic 630 (corresponding to usage confirmation logic 110 from FIG. 1) that includes a validation algorithm as configured by a user to validate measured meter data. In different examples, logic 630 may be implemented in hardware, a non-transitory computer-readable medium with stored instructions, firmware, and/or combinations thereof. While the logic 630 is illustrated as a hardware component attached to the bus 608, it is to be appreciated that in other embodiments, logic 630 could be implemented in the processor 602, a module stored in memory 604, or a module stored in disk 606.

In one embodiment, logic 630 or the computer 600 is a means (e.g., structure: hardware, non-transitory computer-readable medium, firmware) for performing the actions described. In some embodiments, the computing device may be a server operating in a cloud computing system, a server configured in a Software as a Service (SaaS) architecture, a smart phone, laptop, tablet computing device, and so on.

The means may be implemented, for example, as an ASIC programmed to facilitate the generation of a validation algorithm and the applying of the validation algorithm to measured meter data and statistical data derived from historical usage data. The means may also be implemented as stored computer executable instructions that are presented to computer 600 as data 616 that are temporarily stored in memory 604 and then executed by processor 602.

Logic 630 may also provide means (e.g., hardware, non-transitory computer-readable medium that stores executable instructions, firmware) to off-load processing of the computing device from a peak time to a non-peak time. The non-peak time corresponds to a time span when measured meter data is not being received and validated. The peak time corresponds to a different span of time when the measured meter data is being received and validated.

Generally describing an example configuration of the computer 600, the processor 602 may be a variety of various processors including dual microprocessor and other multi-processor architectures. A memory 604 may include volatile memory and/or non-volatile memory. Non-volatile memory may include, for example, ROM, PROM, and so on. Volatile memory may include, for example, RAM, SRAM, DRAM, and so on.

A storage disk 606 may be operably connected to the computer 600 via, for example, an input/output interface (e.g., card, device) 618 and an input/output port 610. The disk 606 may be, for example, a magnetic disk drive, a solid state disk drive, a floppy disk drive, a tape drive, a Zip drive, a flash memory card, a memory stick, and so on. Furthermore, the disk 606 may be a CD-ROM drive, a CD-R drive, a CD-RW drive, a DVD ROM, and so on. The memory 604 can store a process 614 and/or a data 616, for example. The disk 606 and/or the memory 604 can store an operating system that controls and allocates resources of the computer 600.

The computer 600 may interact with input/output devices via the i/o interfaces 618 and the input/output ports 610. Input/output devices may be, for example, a keyboard, a microphone, a pointing and selection device, cameras, video cards, displays, the disk 606, the network devices 620, and so on. The input/output ports 610 may include, for example, serial ports, parallel ports, and USB ports.

The computer 600 can operate in a network environment and thus may be connected to the network devices 620 via the i/o interfaces 618, and/or the i/o ports 610. Through the network devices 620, the computer 600 may interact with a network. Through the network, the computer 600 may be logically connected to remote computers. Networks with which the computer 600 may interact include, but are not limited to, a LAN, a WAN, and other networks.

Systems, methods, and other embodiments have been described that are configured to validate measured meter data by applying a user-selected or user-configured validation algorithm to the measured meter data and historical usage data in a manner that off-loads processing from a peak time. In one embodiment, a pre-calculation module is configured to generate statistical data from historical usage data collected from an electrical grid by a grid head-end device and store the statistical data in a memory. A validation module is configured to generate pass/fail data by applying a validation algorithm to the statistical data and measured meter data collected from the electrical grid by the grid head-end device. The validation algorithm is selected or configured by a user to validate the measured meter data. A control module is configured to command the pre-calculation module to, during a non-peak time, access the historical usage data from a database device and generate the statistical data from the historical usage data to off-load processing from a peak time. The control module is also configured to command the validation module to, during the peak time, access the statistical data from the memory, receive the measured meter data from the grid head-end device, and generate the pass/fail data. The non-peak time corresponds to a time span when the measured meter data is not being received and validated. The peak time corresponds to a different time span when the measured meter data is being received and validated.

Definitions and Other Embodiments

In another embodiment, the described methods and/or their equivalents may be implemented with computer executable instructions. Thus, in one embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on). In one embodiment, a computing device is implemented with one or more executable algorithms that are configured to perform any of the disclosed methods.

In one or more embodiments, the disclosed methods or their equivalents are performed by either: computer hardware configured to perform the method; or computer software embodied in a non-transitory computer-readable medium including an executable algorithm configured to perform the method.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology. Blocks may be combined or separated into multiple actions/components. Furthermore, additional and/or alternative methodologies can employ additional actions that are not illustrated in blocks. The methods described herein are limited to statutory subject matter under 35 U.S.C § 101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
RAM: random access memory.
DRAM: dynamic RAM.
SRAM: synchronous RAM.
ROM: read only memory.
PROM: programmable ROM.
EPROM: erasable PROM.
EEPROM: electrically erasable PROM.
USB: universal serial bus.
WAN: wide area network.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). An operable connection may include one entity generating data and storing the data in a memory, and another entity retrieving that data from the memory via, for example, instruction control. Logical and/or physical communication channels can be used to create an operable connection.

A "data structure", as used herein, is an organization of data in a computing system that is stored in a memory, a storage device, or other computerized system. A data structure may be any one of, for example, a data field, a data file, a data array, a data record, a database, a data table, a graph, a tree, a linked list, and so on. A data structure may be formed from and contain many other data structures (e.g., a database includes many data records). Other examples of data structures are possible as well, in accordance with other embodiments.

"Computer-readable medium" or "computer storage medium", as used herein, refers to a non-transitory medium that stores instructions and/or data configured to perform one or more of the disclosed functions when executed. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C § 101.

"Logic", as used herein, represents a component that is implemented with computer or electrical hardware, a non-transitory medium with stored instructions of an executable application or program module, and/or combinations of these to perform any of the functions or actions as disclosed herein, and/or to cause a function or action from another logic, method, and/or system to be performed as disclosed herein. Equivalent logic may include firmware, a microprocessor programmed with an algorithm, a discrete logic (e.g., ASIC), at least one circuit, an analog circuit, a digital circuit, a programmed logic device, a memory device containing instructions of an algorithm, and so on, any of which may be configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. For example, if greater speed is a consideration, then hardware would be selected to implement functions. If a lower cost is a consideration, then stored instructions/executable application would be selected to implement the functions. Logic is limited to statutory subject matter under 35 U.S.C. § 101.

"User", as used herein, includes but is not limited to one or more persons, computers or other devices, or combinations of these.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. § 101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

To the extent that the phrase "one or more of, A, B, and C" is used herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be used.

What is claimed is:

1. A computer-implemented method performed by a computing device where the computing device includes at least a processor for executing instructions from a memory, the method comprising:
    providing a graphical user interface that facilitates custom configuration of a validation algorithm by a user, via a processor, to validate measured meter data collected from an electrical grid via a grid head-end device;
    accessing historical usage data from a database device during a non-peak time, via the processor, to offload processing from a peak time, wherein the historical usage data is previously collected from the electrical grid via the grid head-end device and stored in the database device, and wherein the non-peak time corresponds to a time span when the measured meter data is not being received and processed for validation, and the peak time corresponds to a different time span when the measured meter data is being received and processed for validation;
    during the non-peak time, generating statistical data from the historical usage data and storing the statistical data in a memory, via the processor, to off-load processing from the peak time;
    during the peak time, receiving the measured meter data from the grid head-end device and accessing the statistical data from the memory via the processor;
    subsequent to the validation algorithm being configured by the user, validating the measured meter data at least in part by applying, via the processor, the validation algorithm to the statistical data and the measured meter data to generate pass/fail data during the peak time; and
    controlling issuance of an alert based on whether the pass/fail data indicates that the measured meter data passes the validating or indicates that the measured meter data fails the validating.

2. The method of claim 1, wherein the graphical user interface further facilitates manual selection of a pre-existing validation algorithm by the user via the processor.

3. The method of claim 1, further comprising generating control commands via the processor, based on the non-peak time, to control the accessing of the historical usage data from the database device and the generating of the statistical data.

4. The method of claim 1, further comprising generating control commands via the processor, based on the peak time, to control the receiving of the measured meter data from the grid head-end device, the accessing of the statistical data from the memory, and the validating of the measured meter data.

5. The method of claim 1, further comprising displaying the graphical user interface, via the processor, on a display screen.

6. The method of claim 1, wherein the controlling issuance of the alert comprises issuing a notice to investigate a possible failure of the grid head-end device.

7. The method of claim 1, further comprising outputting, via the processor, the measured meter data.

8. The method of claim 1, wherein the historical usage data includes at least one of interval consumption data or register (scalar) consumption data corresponding to a plurality of electrical meters of consumers.

9. The method of claim 1, wherein the measured meter data includes at least one of interval consumption data or register (scalar) consumption data corresponding to a plurality of electrical meters of consumers.

10. The method of claim 1, wherein the validation algorithm includes at least one of mathematical functions or logical functions.

11. A computing system, comprising:
    a processor;
    a memory;
    a pre-calculation module stored in a non-transitory computer-readable medium including instructions that when executed cause the processor to generate statistical data from historical usage data collected from an electrical grid by a grid head-end device and store the statistical data in the memory;
    a validation module stored in the non-transitory computer-readable medium including instructions that when executed cause the processor to generate at least pass/fail data at least in part by applying a validation algorithm to the statistical data and measured meter data collected from the electrical grid by the grid head-end device and to control issuance of an alert based on whether the pass/fail data indicates that the measured meter data passes a validation by the validation module or indicates that the measured meter data fails the validation by the validation module, wherein the validation algorithm is selected or configured by a user to validate the measured meter data; and
    a control module stored in the non-transitory computer-readable medium including instructions that when executed cause the processor to:
        command the pre-calculation module to, during a non-peak time, access the historical usage data from a database device and generate the statistical data from the historical usage data to off-load processing of the computing system from a peak time, and
        command the validation module to, during the peak time, access the statistical data from the memory, receive the measured meter data from the grid head-end device, and generate at least the pass/fail data,
        wherein the non-peak time corresponds to a time span when the measured meter data is not being received and processed for validation by the computing system, and the peak time corresponds to a different time span when the measured meter data is being received and processed for validation by the computing system.

12. The computing system of claim 11, further comprising the database device configured to store at least the historical usage data.

13. The computing system of claim 11, wherein the validation module stored in the non-transitory computer-readable medium includes instructions that when executed cause the processor to output at least the pass/fail data and the measured meter data.

14. The computing system of claim 11, further comprising a visual user interface module stored in the non-transitory computer-readable medium including instructions that when executed cause the processor to provide a graphical user interface that facilitates custom configuration of the validation algorithm by the user.

15. The computing system of claim 14, further comprising a display screen configured to display and facilitate user interaction with at least the graphical user interface provided by the visual user interface module.

16. The computing system of claim 11, further comprising a visual user interface module stored in the non-transitory computer-readable medium including instructions that when executed cause the processor to provide a graphical user interface that facilitates manual selection of the validation algorithm by the user.

17. The computing system of claim 16, further comprising a display screen configured to display and facilitate user interaction with at least the graphical user interface provided by the visual user interface module.

18. A non-transitory computer-readable medium storing instructions that, when executed by one or more processors of a computing device, cause the computing device to at least:
   access historical usage data from a database device during a non-peak time, via the one or more processors, to offload processing from a peak time, wherein the historical usage data is previously collected from an electrical grid via a grid head-end device and stored in the database device, and wherein the non-peak time corresponds to a time span when measured meter data is not being received and processed for validation, and the peak time corresponds to a different time span when the measured meter data is being received and processed for validation;
   during the non-peak time, generate statistical data from the historical usage data and store the statistical data in a memory, via the one or more processors, to off-load processing from the peak time;
   during the peak time, receive the measured meter data from the grid head-end device and access the statistical data from the memory via the one or more processors;
   validate the measured meter data at least in part by applying, via the one or more processors, a validation algorithm to the statistical data and the measured meter data to generate pass/fail data during the peak time; and
   control issuance of an alert based on whether the pass/fail data indicates that the measured meter data passes the validating of the measured meter data or indicates that the measured meter data fails the validating of the measured meter data.

19. The non-transitory computer-readable medium of claim 18, wherein the instructions further comprise instructions that, when executed by the one or more processors, cause the computing device to at least provide a graphical user interface that facilitates at least one of manual selection or custom configuration of the validation algorithm by a user, via the one or more processors.

20. The non-transitory computer-readable medium of claim 18, wherein the instructions further comprise instructions that, when executed by the one or more processors, cause the computing device to at least:
   generate first control commands via the one or more processors to control, based on the non-peak time, the accessing of the historical usage data from the database device and the generating of the statistical data; and
   generate second control commands via the one or more processors to control, based on the peak time, the receiving of the measured meter data from the grid head-end device, the accessing of the statistical data from the memory, and the validating of the measured meter data.

\* \* \* \* \*

UNITED STATES PATENT AND TRADEMARK OFFICE
CERTIFICATE OF CORRECTION

PATENT NO. : 10,393,779 B2
APPLICATION NO. : 15/086273
DATED : August 27, 2019
INVENTOR(S) : Duncan-Wilson Page 1 of 1

It is certified that error appears in the above-identified patent and that said Letters Patent is hereby corrected as shown below:

In the Specification

In Column 3, Lines 61-64, delete "Thus the display screen 160 may represent multiple computing devices/terminals that allow users to access and receive services from usage confirmation logic 110 via networked computer communications." and insert the same on Column 3, Line 60 as a continuation of the same paragraph.

Signed and Sealed this
Twenty-fifth Day of August, 2020

Andrei Iancu
*Director of the United States Patent and Trademark Office*